US008716050B2

(12) United States Patent
Wong et al.

(10) Patent No.: US 8,716,050 B2
(45) Date of Patent: May 6, 2014

(54) OXIDE MICROCHANNEL WITH CONTROLLABLE DIAMETER

(71) Applicant: The Hong Kong University of Science and Technology, Clear Water Bay (HK)

(72) Inventors: Man Wong, Sai Kung (CN); Fan Zeng, Clear Water Bay (CN)

(73) Assignee: The Hong Kong University of Science and Technology, Kowloon (HK)

( * ) Notice: Subject to any disclaimer, the term of this patent is extended or adjusted under 35 U.S.C. 154(b) by 0 days.

(21) Appl. No.: 13/721,496

(22) Filed: Dec. 20, 2012

(65) Prior Publication Data

US 2013/0221495 A1  Aug. 29, 2013

Related U.S. Application Data

(60) Provisional application No. 61/634,171, filed on Feb. 24, 2012.

(51) Int. Cl.
*H01L 21/00* (2006.01)
*H01L 29/82* (2006.01)

(52) U.S. Cl.
USPC ................ 438/50; 438/53; 257/417; 257/419

(58) Field of Classification Search
USPC ........... 438/49, 50, 51, 53; 257/415, 417, 419
See application file for complete search history.

(56) References Cited

U.S. PATENT DOCUMENTS

| 5,992,769 | A | * | 11/1999 | Wise et al. .................... 239/548 |
| 6,100,107 | A | | 8/2000 | Lei et al. |
| 6,216,343 | B1 | | 4/2001 | Leland et al. |
| 6,281,254 | B1 | | 8/2001 | Nakajima et al. |
| 6,629,820 | B2 | | 10/2003 | Kornelsen |
| 6,750,076 | B2 | * | 6/2004 | Corso ............................. 438/48 |
| 6,878,567 | B2 | * | 4/2005 | Winer et al. .................... 438/53 |
| 7,075,104 | B2 | | 7/2006 | Faris |
| 7,585,743 | B2 | | 9/2009 | Renna et al. |
| 7,763,487 | B2 | * | 7/2010 | Villa et al. ...................... 438/50 |
| 2004/0046290 | A1 | | 3/2004 | Kim et al. |
| 2008/0224242 | A1 | * | 9/2008 | Villa et al. ..................... 257/419 |

OTHER PUBLICATIONS

Chuang, et al., "A novel fabrication method of embedded microchannels by using SU-8 thick-film photoresists". Copyright 2003 Elsevier Science B.V, 6 pages.

Tay, et al., "A novel micro-machining method for the fabrication of thick-film SU-8 embedded micro channels". 0960-1317/01/010027+06$30.00, Copyright 2001 IOP Publishing Ltd., 7 pages.

Guerin, et al., "Simple and low cost fabrication of embedded microchannels by using a new thick-film photoplastic". Transducers '97, 1997 International Conference on Solid-State Sensors and Actuators, Chicago, Jun. 16-19, 1997, 0-7803-3829-4/97/$10.00, Copyright 1997 IEEE, 4 pages.

(Continued)

*Primary Examiner* — Kevin M Picardat
(74) *Attorney, Agent, or Firm* — Amin, Turocy & Watson, LLP

(57) ABSTRACT

Described herein is a microchannel that is formed beneath and parallel to a surface of a silicon substrate. Silicon migration technology is utilized to form a microchannel that is buried beneath the surface of the silicon substrate. Etching opens at least one end of the microchannel. Oxidization is utilized through the open end of the microchannel to facilitate a controlled diameter of the microchannel.

20 Claims, 12 Drawing Sheets

(56) References Cited

OTHER PUBLICATIONS

Jo, et al., "Three-dimensional micro-channel fabrication in Polydimethylsiloxane (PDMS) Elastomer." Journal of Microelectromechanical Systems, vol. 9, No. 1, Mar. 2000, 1057-7157/00$10, Copyright 2000 IEEE.

Yamasaki, et al., "Three-dimensional micro-channels in polymers: one-step fabrication". Applied Physics A, Materials Science & Processing, DOI:10.1007/s00339-003-2191-8, Copyright Springer-Verlag 2003, 3 pages.

Chow, et al., "Microfluidic Channel fabrication by PDMS-interface bonding." Institute of Physics Publishing, DOI:10.1088/0964-1726/15/1/018, Copyright 2006 IOP Publishing Ltd., 6 pages.

Wu, et al., "Fabrication of Complex Three-Dimensional Microchannel Systems in PDMS". Copyright American Chemical Society, 6 pages.

Xu, et al., "Room-Temperature Imprinting Method for Plastic Microchannel Fabrication". Analytical Chemistry, vol. 72, No. 8, Apr. 15, 2000, Copyright American Chemical Society, 4 pages.

Cohen, et al., "Fabrication and preliminary testing of a planar membraneless microchannel fuel cell". DOI:10.1016/j.jpowsour.2004.06.072, Copyright Elsevier B.V., 10 pages.

Dwivedi, et al., "Fabrication of very smooth walls and bottoms of silicon microchannels for heat dissipation of semiconductor devices." Microelectronics Journal 31 (2000) 405-410, Copyright 2000 Elsevier Science Ltd., 5 pages.

Papautsky, et al., "A Low-Temperature IC-Compatible Process for Fabricating Surface-Micromachined Metallic Microchannels." Journal of Microelectromechanical Systems, vol. 7, No. 2, Jun. 1998, 1057-7157/98, Copyright 1998 IEEE.

Wang, et al., "Low temperature bonding for microfabrication of chemical analysis device". Sensors and Actuators B 45 (1997) 199-207, Copyright 1997 Elsevier Science S.A, 9 pages.

Lee, et al., "A Nanochannel Fabrication Technique without Nanolithography". Nano letters 2003 vol. 3, No. 10, 1339-1340, Copyright 2003 American Chemical Society, 2 pages.

* cited by examiner

OXIDE MICROCHANNEL WITH CONTROLLABLE DIAMETER

CROSS REFERENCE TO RELATED APPLICATION

This application claims priority to U.S. provisional application No. 61/634,171, entitled: "OXIDE MICROCHANNEL WITH CONTROLLABLE DIAMETER AND METHOD OF MANUFACTURING THE SAME," and filed on Feb. 24, 2012, the entirety of which application is incorporated herein by reference.

TECHNICAL FIELD

This disclosure generally relates to the formation of an oxide microchannel, e.g., with a controllable diameter lying below and running parallel to a flat surface.

BACKGROUND

Microchannels are generally defined as channels with hydraulic diameters less than or equal to 1 mm. Microchannels have a wide range of applications with regard to micro-technologies, such as biological engineering applications, thermal engineering applications, and the like.

Existing technologies for microchannel formation include molding for plastic microchannels, folding for metal microchannels, as well as bonding wafers with cylinders or trenches vertically etched with microfabrication technologies. Microchannels lying below and running parallel to the surface of the wafer have not been obtainable by bonding vertically etched wafers. Moreover, the diameter of the microchannels manufactured with the traditional methods have not been controllable with precision and there have been limitations on the smallest diameter that can be obtained.

The above-described background is merely intended to provide an overview of contextual information regarding microchannels, and is not intended to be exhaustive. Additional context may become apparent upon review of one or more of the various non-limiting embodiments of the following detailed description.

SUMMARY

The following presents a simplified summary of the specification in order to provide a basic understanding of some aspects of the specification. This summary is not an extensive overview of the specification. It is intended to neither identify key or critical elements of the specification nor delineate any scope of particular embodiments of the specification, or any scope of the claims. Its sole purpose is to present some concepts of the specification in a simplified form as a prelude to the more detailed description that is presented later.

In accordance with one or more embodiments and corresponding disclosure, various non-limiting aspects are described in connection with formation of microchannels that lie below a surface and run parallel to the surface. The diameters of the microchannels are controllable. An oxidation process allows for precise control of the diameters of the microchannels fabricated by silicon migration technology.

Silicon migration technology is utilized to obtain a microchannel that is buried beneath a silicon surface. Subsequent etching opens the two endings of the microchannel, and oxidation thereafter reduces the diameter of the microchannel to the desired size. The diameter of the microchannel obtained by silicon migration technology can also be increased by oxidizing the microchannel and removing part of the oxide from the oxide microchannel.

In an embodiment, a method is described that can facilitate formation of microchannels with controllable diameters. A pattern is etched into a silicon substrate, and the pattern is annealed, which results in a structural transformation of the silicon substrate into a microchannel. A reservoir is etched into the silicon substrate that connects the microchannel and the reservoir. The pattern is then oxidized to facilitate control of the diameter of the microchannel.

According to another embodiment, an apparatus is described. The apparatus includes a silicon surface, a first reservoir within the silicon surface, a second reservoir within the silicon surface, and an oxidized microchannel with a hydraulic diameter of about 1 millimeter or less connecting the first reservoir and the second reservoir and buried beneath the silicon surface. The microchannel has a controllable diameter.

In a further embodiment, a method is described that can facilitate formation of microchannels with controllable diameters. Silicon migration is applied to a silicon substrate to facilitate formation of a microchannel structure in the silicon substrate. The silicon substrate is then oxidized to facilitate formation of an oxidized microchannel with a hydraulic diameter of 1 millimeter or less in the silicon substrate that is parallel to a surface of the silicon substrate and buried within the silicon substrate.

The following description and the drawings set forth certain illustrative aspects of the specification. These aspects are indicative, however, of but a few of the various ways in which the various embodiments of the specification may be employed. Other aspects of the specification will become apparent from the following detailed description of the specification when considered in conjunction with the drawings.

BRIEF DESCRIPTION OF THE DRAWINGS

Numerous aspects and embodiments are set forth in the following detailed description, taken in conjunction with the accompanying drawings, in which like reference characters refer to like parts throughout, and in which.

DETAILED DESCRIPTION

Figure 1:
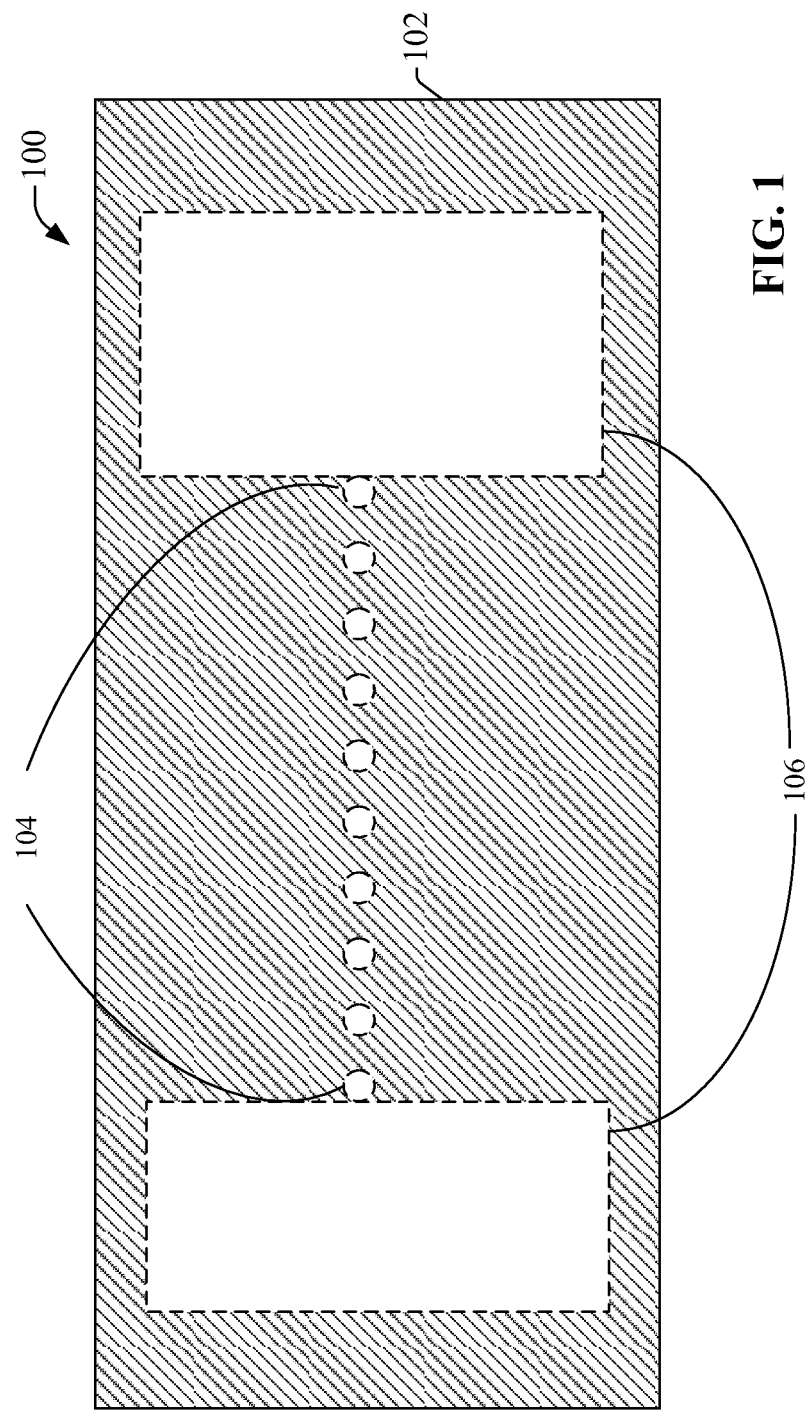
FIG. 1 is an example non-limiting schematic diagram of an example mask layout that defines a pattern of structures to be etched into a silicon substrate and annealed to form the microchannel and reservoir, according to an embodiment.

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that the certain aspects of disclosure may be practiced without these specific details, or with other methods, components, molecules, etc. In other instances, well-known structures and devices are shown in block diagram form to facilitate description and illustration of the various embodiments.

In accordance with one or more embodiments described in this disclosure, a microchannel formed below and running parallel to a flat surface (e.g., a surface of a semiconductor substrate, such as a material containing silicon) with a controllable diameter is described. One or more endings of the microchannel can be opened through etching to produce one or more reservoirs. After the etching, the microchannel and the reservoirs can be oxidized to facilitate sizing of the diameter of the microchannel.

In a semiconductor containing silicon, silicon migration technology can be used to create the microchannel formed below and running parallel to the flat surface. Silicon migration can be accomplished in response to etching a pattern into the substrate and subsequently annealing the pattern to facilitate silicon migration.

Figure 2:
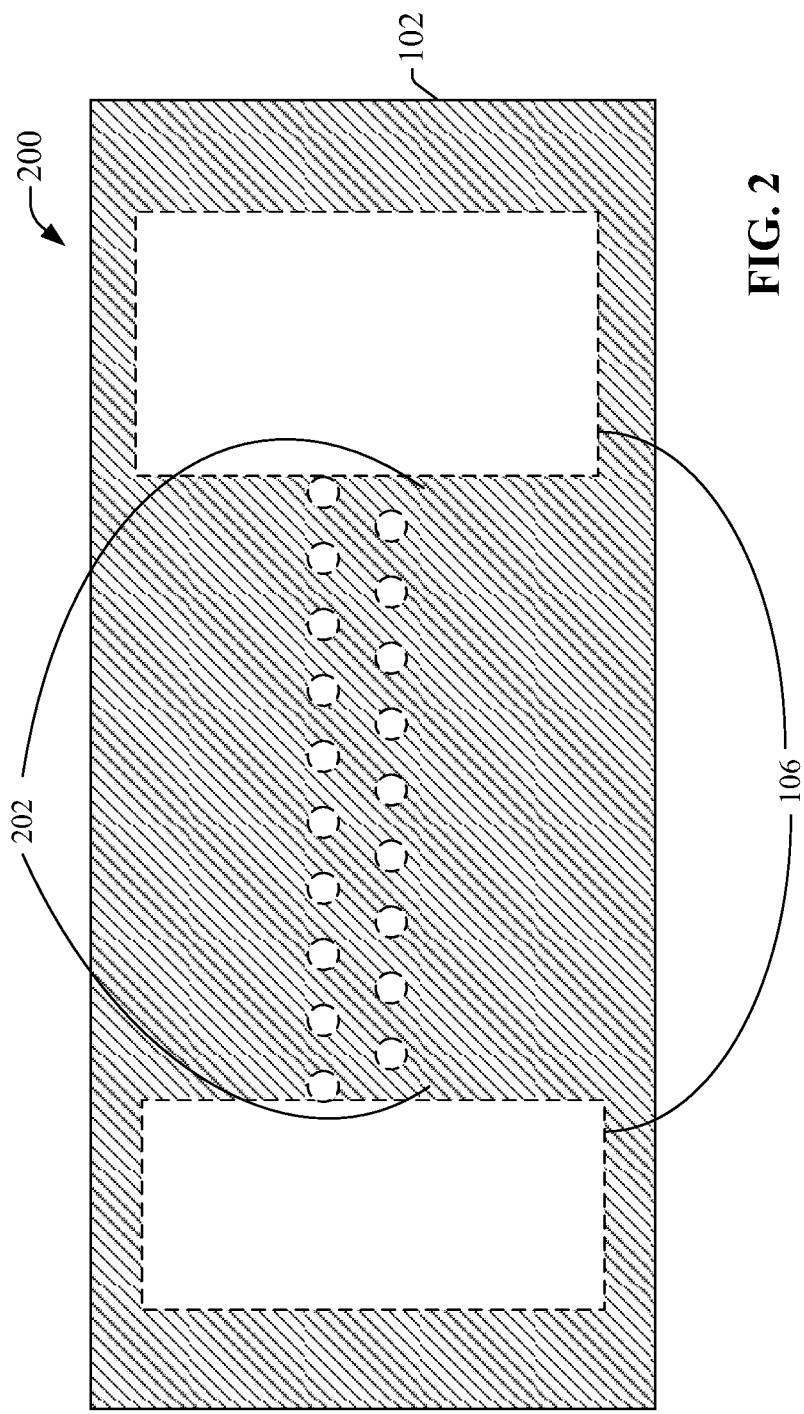
FIG. 2 is an example non-limiting schematic diagram of an alternate example mask layout that defines a pattern of structures to be etched into a silicon substrate and annealed to form the microchannel and reservoir, according to an embodiment.
Figure 3:
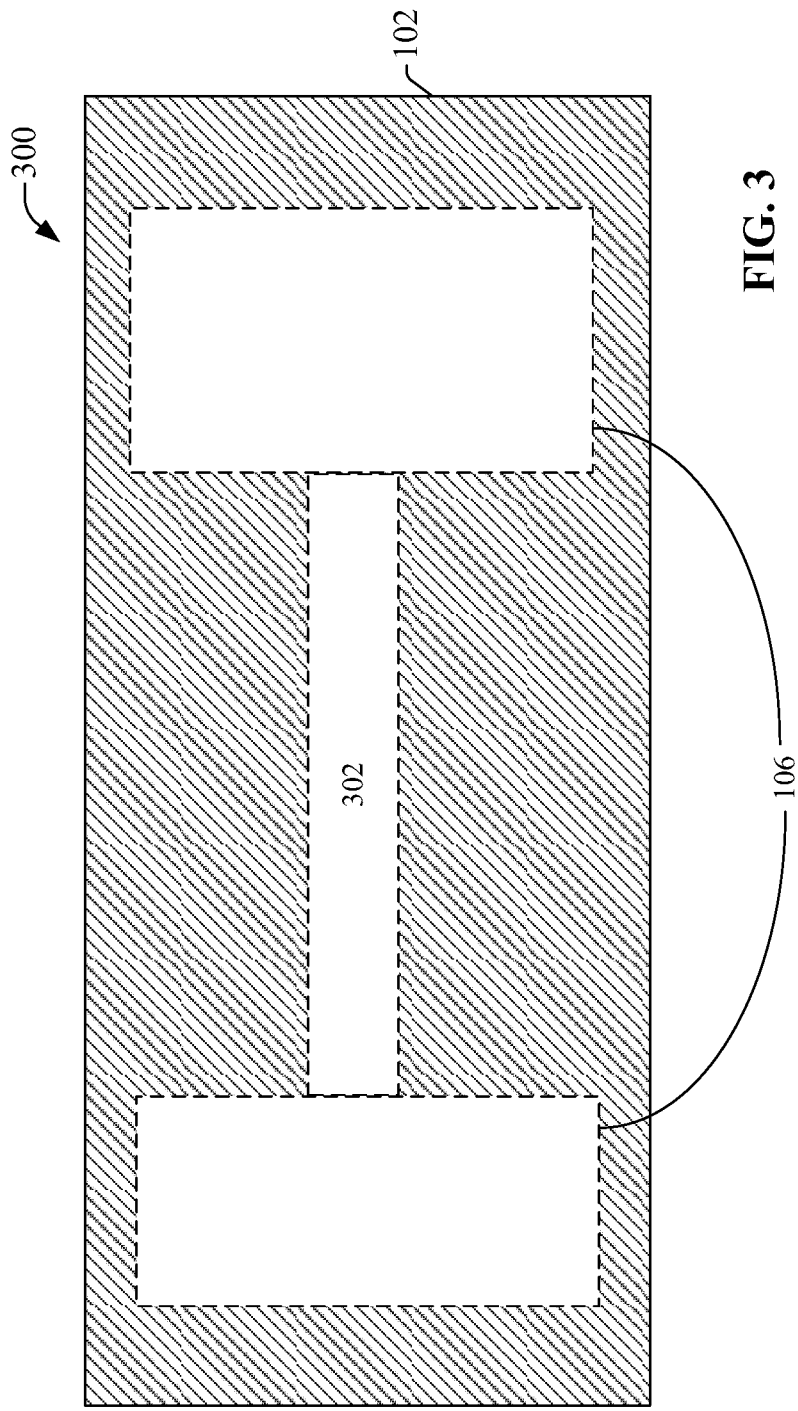
FIG. 3 is an example non-limiting schematic diagram of a further example mask layout that defines a pattern of structures to be etched into a silicon substrate and annealed to form the microchannel and reservoir, according to an embodiment.

A mask layout can be used to define the pattern of a structure that will be etched into the substrate to facilitate formation of a microchannel. Non-limiting example schematic diagrams 100, 200, 300 of differently shaped mask layouts are illustrated in FIGS. 1-3. The mask layouts 100, 200, 300 each define the pattern of a structure that can facilitate formation of a microchannel beneath the surface of the substrate 102 and running parallel to the surface of the substrate 102.

FIGS. 1, 2 and 3 each show a top-down view of substrate 102, illustrating the alignment of patterns defined by mask layouts 100, 200, 300 with the substrate 102. The patterns can include two to-be-etched patterns. In FIG. 1, the patterns are shown at 104 and 106. In FIG. 2, the patterns are shown at 202 and 106. In FIG. 3, the patterns are shown at 302 and 106. The patterns in any one of 100, 200, or 300, in an embodiment, can be included on a single mask so that they are etched at substantially the same time. In another embodiment, the patterns in any one of 100, 200, or 300 can be aligned on two or more separate masks so that they are etched at different times.

Patterns 104, 202 and 302 define patterns of different structures (also referred to as vertical structures when etched into the substrate 102) that can be etched into the substrate 102 and transformed into a buried microchannel. For example, the structures can be transformed according to a silicon migration technology. The patterns can be ellipses, circles 102 or 202 or rectangles 302. However, the patterns are not limited to only ellipses, circles or rectangles. The patterns can include any type of shape that can facilitate the formation of a microchannel.

The patterns 104, 202 and 302 can include a matrix of geometries. The matrix of geometries can be a single vector (e.g., the row vector of 104). The matrix of geometries can also include a matrix of any dimensions (e.g., the hexagonally arranged matrix of 202). It will be understood that the matrix can be aligned in any type of shape that facilitates the formation of the microchannel.

The pattern 106 denotes the two reservoirs to be etched. The reservoirs shown in pattern 106 are arranged in such a matter as to be connected by the microchannel formed from patter 104, 202, or 302. The reservoirs can be etched into the substrate 102 at the same time as the matrix of geometries is etched into the substrate 102 or at a time after the matrix of geometries is etched into the substrate 102.

As illustrated, both ends of the buried microchannel can be exposed after the reservoirs are opened. In another embodiment, a single end of the buried microchannel can be exposed by the opening of a single reservoir. The shape of the reservoirs can be arbitrary, as long as the reservoirs facilitate the opening of at least one end of the microchannel.

The substrate 102 can be any type of wafer that can house a microchannel buried within. In an embodiment, the substrate 102 made of any material that contains silicon. It will be understood that, while silicon migration technology is described herein, other technologies that facilitate formation of a buried microchannel in silicon and other materials can be utilized according to the description herein. Silicon migration technologies are described for ease of explanation and illustration.

The microchannel can be buried beneath the surface of the substrate 102 (e.g., at a controllable depth below the surface) and can run parallel to the surface of the substrate 102. The diameter of the microchannel can be precisely controlled.

For example, the microchannel can be formed by silicon migration technology with an initial diameter at a distance below the substrate surface. The initial diameter of the microchannel and the distance between the channel and the substrate surface can be adjusted according to the ratio of the size of the part to be etched away and the size of the part to be protected during etching, as well as the etching depth. The distance between the channel and the substrate surface can also be increased by silicon expitaxy or decreased by any method of silicon etching.

The final diameter of the microchannel can be precisely controlled by exposing one or both ends of the microchannel to an oxidizing ambient and oxidizing the microchannel by thermal oxidation. The diameter of the microchannel can be reduced by controlling the oxidation time to control the thickness of the silicon wall of the microchannel that are going to be oxidized. The diameter of the microchannel can be increased by etching part of the obtained oxide away. The etching time can also be precisely controlled to control the final diameter of the microchannel.

Figure 4:
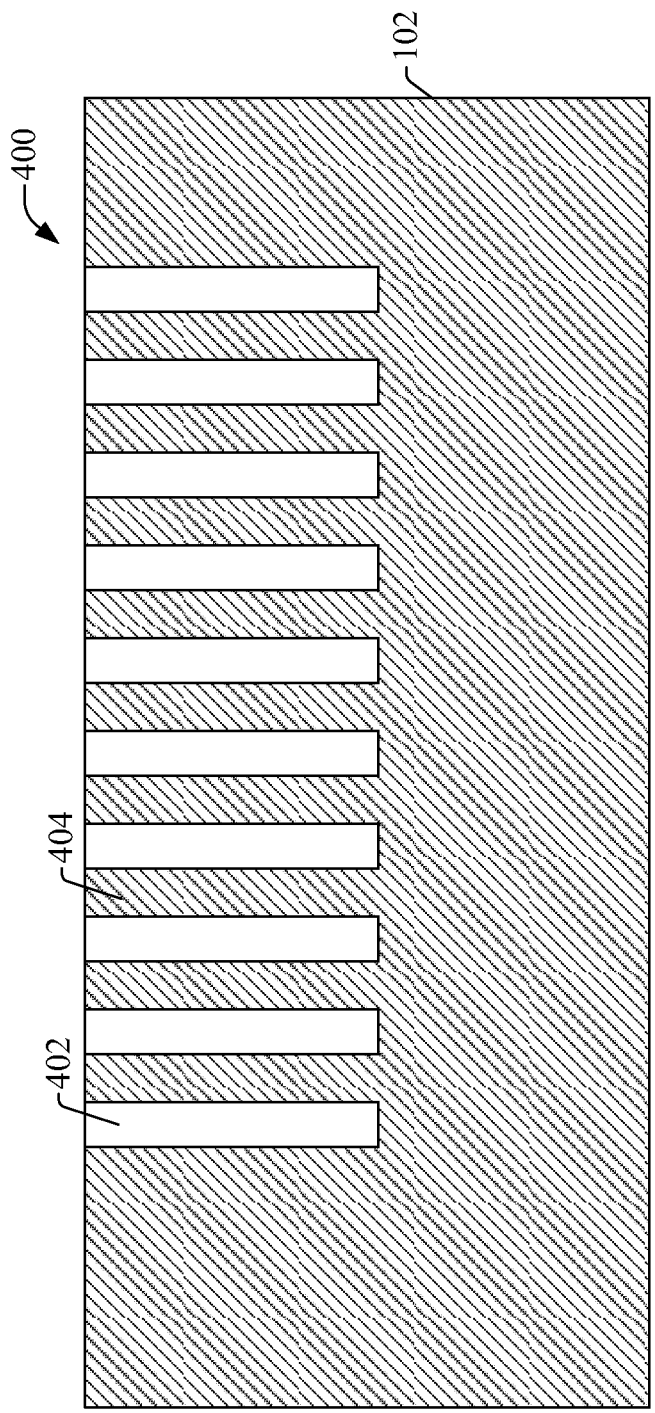
FIG. 4 is an example non-limiting schematic cross-section of an etched pattern of structures in the silicon substrate, according to an embodiment.

Referring now to FIG. 4, illustrated is an example non-limiting schematic cross-section 400 of an etched pattern of structures 402 in the silicon substrate 102, according to an embodiment. The etched pattern of structures 402 can be etched into the substrate by any type of etching technique that facilitates removal of portions of the substrate 102 while leaving substantially vertical sides.

In an embodiment, the etching technique can include a dry etching technique. Dry etching generally refers to the removal of a material of the substrate 102 within a masked pattern (e.g., shown in FIG. 1, 2 or 3) by exposing the substrate 102 to a bombardment of ions that dislodge portions of the substrate 102 from the exposed surface. The bombardment of ions can be bombardment with plasma of one or more reactive gases, such as fluorocarbons, oxygen, chlorine, boron trichloride. The plasma can include another gas, such as nitrogen, argon, helium, or the like.

One type of dry etching technique is deep reactive-ion etching. Deep reactive-ion etching is a highly anisotropic etching process used to create deep penetration (deeper than reactive ion etching, as deep as 600 μm), steep-sided holes and trenches in the substrate 102, typically with high aspect ratios.

A deep reactive-ion technique can use fluorine ions (F⁻) to facilitate the etching. This deep reactive-ion etching technique can achieve steep sided holes and trenches because the sidewalls are substantially protected. Fluorine radicals can spontaneously etch the silicon substrate 102 and the spontaneous etch rate is reduced at the sidewalls. The deep reactive-ion process utilizes a high plasma density at a low pressure to achieve a fast etching speed. The low pressure can reduce ion scattering so that the ion trajectory is mostly vertical, so the ion species can be transported into deep trenches.

An example of an anisotropic etchant is $SF_6$, which exhibits a low toxicity compared to $F_2$. For example, in a cryo process deep reactive-ion etching process, $SF_6/O_2$ plasma can be used with a condensed $SiO_xF_y$ mask. In another example, in a Bosh process, a pulsed process or a time multiplexed process, $SF_6/C_4F_8$ can be used as the plasma and the mask can be used with a condensed n-$CF_2$ polymer.

The etched pattern of structures 402 (e.g., pattern 104, 202 or 302 after etching) can include cylinders or trenches, for example. The pattern of structures 402 can include structures of any shape, not solely cylinders or trenches. The shape of the structures in the pattern of structures 402 depends on the shape of the masks (e.g., in FIG. 1, 2 or 3 ). The part of the substrate 102 that is not etched adjacent to the etched pattern of structures 402 is denoted as 404.

Figure 5:
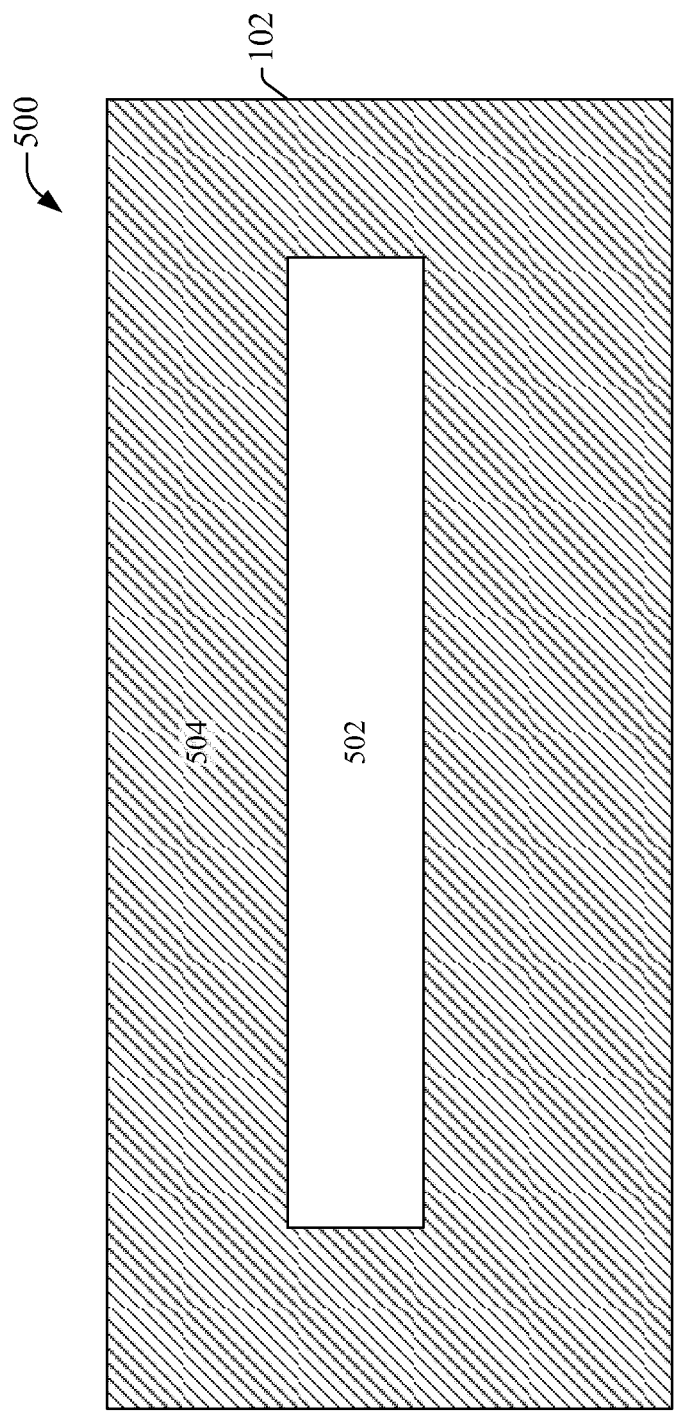
FIG. 5 is an example non-limiting schematic cross section of a microchannel obtained by silicon migration technology after high temperature annealing, according to an embodiment.

After a high temperature anneal in a reducing or inert atmosphere, as shown in the cross-section 500 of FIG. 5, the pattern of structures 402 will eventually merge with each other and become a buried microchannel 502. The part of the substrate 102 that is not etched 404 will eventually merge with each other and become suspended silicon 504. The microchannel 502 and the suspended silicon 504 can be achieved through silicon migration technology after the high temperature annealing.

The silicon migration technology generally refers to a surface migration resulting in a structural transformation of the silicon substrate 102. For example, the non-etched parts of the silicon substrate 102 (represented by 404 in FIG. 4) can migrate to the surface of substrate 102, while the etched portions 402 can form the microchannel because of the empty migrated portions 404. The silicon migration can depend on parameters, such as the temperature of the annealing, the pressure (the pressure of the gas used in the annealing), the type of gas used, the reaction time, and the like.

The high temperature annealing can be conducted at a temperature sufficient induce the silicon migration (in other words, the temperature high enough such that the etched portions 402 can be annealed to facilitate formation of the microchannel). As a non-limiting example, the high temperature annealing can be conducted at a temperature from about 900 degrees Celsius to about 1300 degrees Celsius.

The high temperature annealing can be conducted at a pressure sufficient facilitate the silicon migration. According to a non-limiting example, the high temperature annealing can be conducted at a pressure from about $10^{-10}$ Ton to about 10 Torr.

The gas used in the annealing process can be a reducing gas or an inert gas. Examples of gasses that can be used as an ambient include, but are not limited to, one or more of hydrogen gas, argon gas, helium gas, neon gas, krypton gas, or nitrogen gas.

Figure 6:
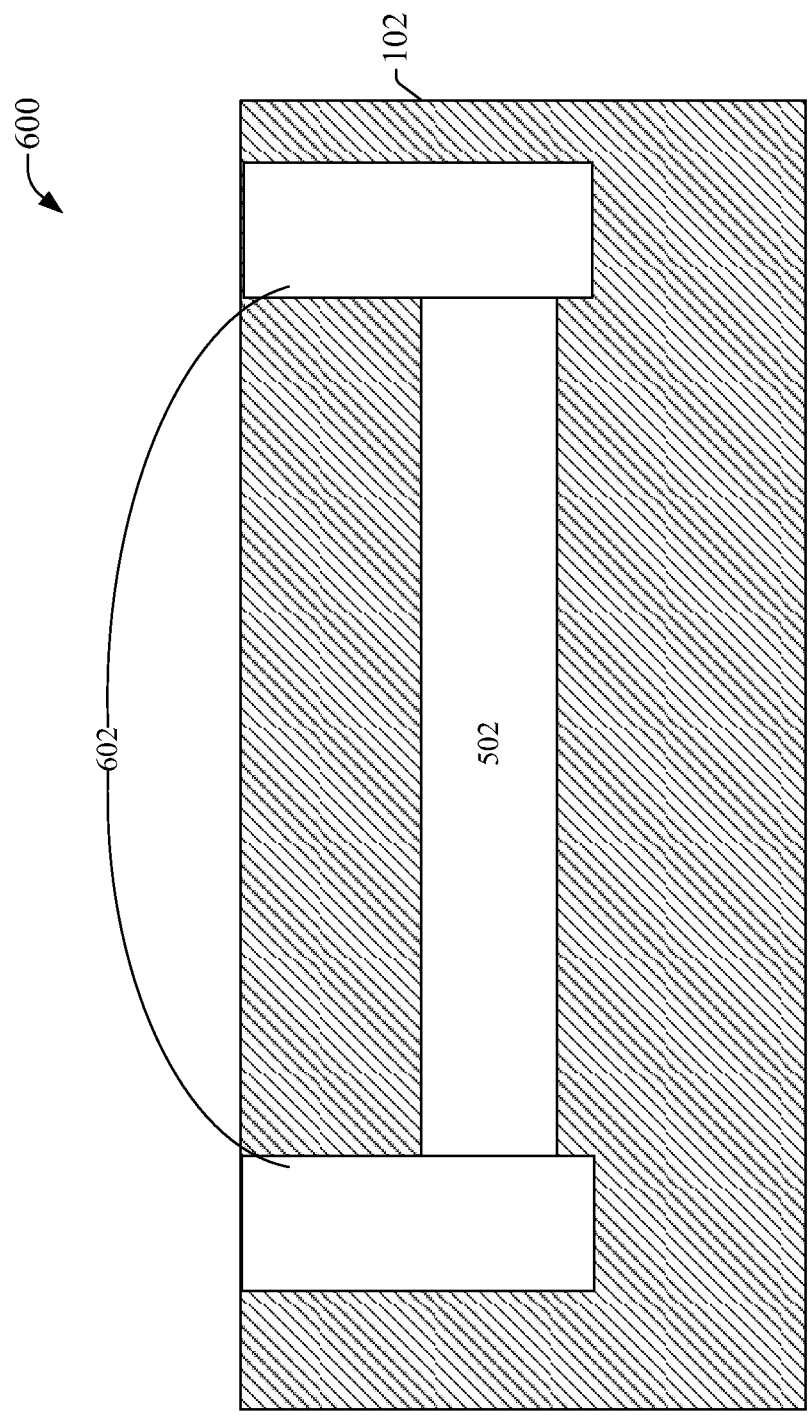
FIG. 6 is an example non-limiting schematic cross section of two reservoirs connected by the microchannel, according to an embodiment.

As shown in the cross section 600 of FIG. 6, one or more reservoirs (e.g., two reservoirs 602 connected by the microchannel 502) can be etched into the substrate 102. The etching of the one or more reservoirs can occur at substantially the same time as the etching of the pattern that will form the microchannel 502. The etching of the one of more reservoirs can also occur after the etching of the pattern that will form the microchannel 502.

Figure 7:
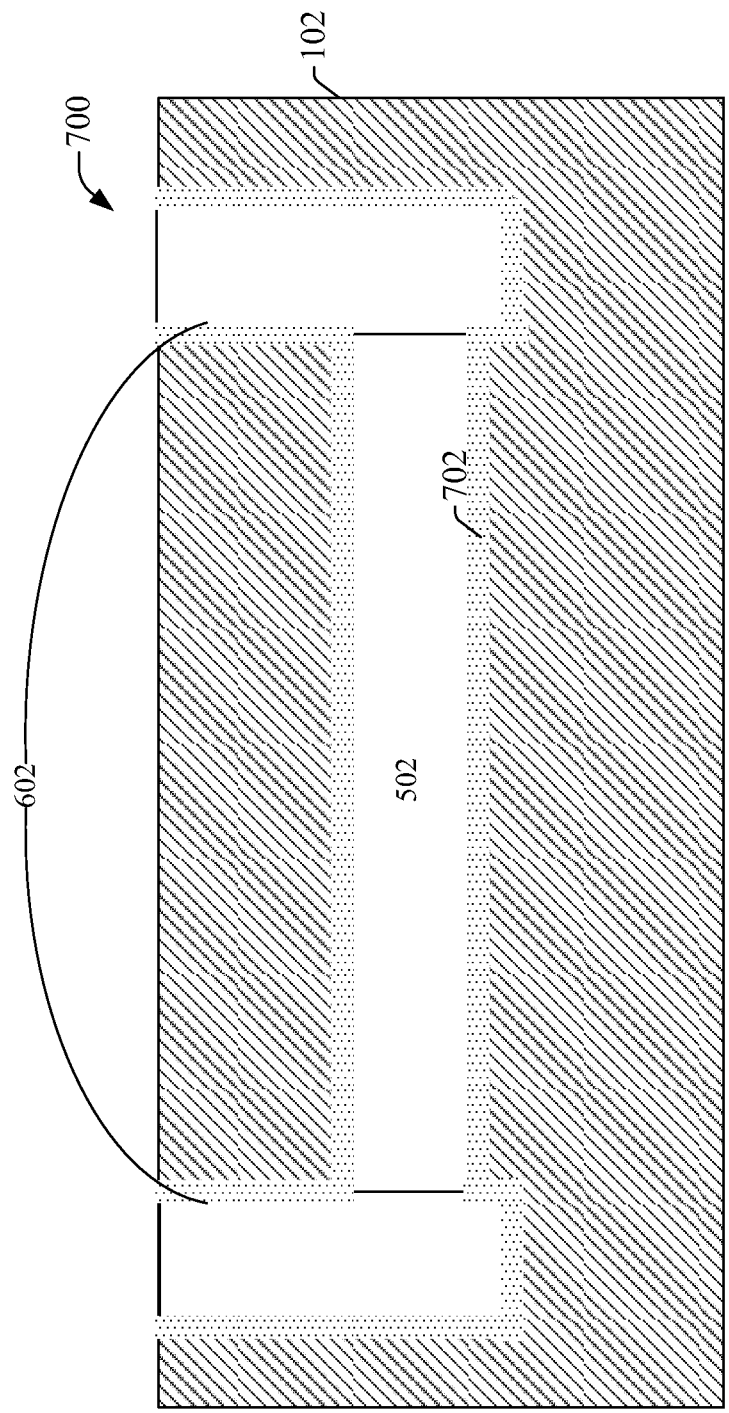
FIG. 7 is an example non-limiting schematic cross section of an oxide microchannel with a final diameter controlled by the oxidation time, according to an embodiment.

The one or more reservoirs can be utilized to facilitate control of the diameter of the microchannel 502. The diameter can be controlled through an oxidation process, as shown in the cross section 700 of FIG. 7.

The oxidation process can be performed on the substrate 102 to oxidize the interior walls of the one or more reservoirs (e.g., two reservoirs 602) and the interior walls of the microchannel 502 to a desired thickness. In an embodiment, the oxidation process can be a thermal oxidation of the substrate 102 that can oxidize the inside walls of the one or more reservoirs and the microchannel so that the diameter (hydraulic diameter) of the microchannel is a desired thickness (an example of the oxide is shown at 702).

Thermal oxidation can produce a thin layer of oxide (e.g., silicon dioxide) on the surface of the substrate 102. The thermal oxidation technique forces an oxidizing agent to diffuse into the substrate 102 at a high temperature and react with the substrate. Thermal oxidation is often performed at a temperature from about 800 degrees Celsius to about 1200 degrees Celsius.

The thermal oxidation can be dry oxidation, using molecular oxygen as the oxidant, or wet oxidation, using water vapor as the oxidant. The oxidizing agent can also include several percent of hydrochloric acid or another agent to remove metal ions that may occur in the oxide.

Thermal oxidation is a well modeled process, so the diameter of the microchannel 502 can be controlled according to the thickness of the oxide. The thickness of the oxide can be controlled according to the Deal-Grove model. According to the Deal-Grove model, the time t required to grow an oxide of thickness $X_o$ at a constant temperature on a bare silicon surface is:

$$t = \frac{X_o^2}{B} + \frac{X_o}{B/A},$$

where A and B are constants that encapsulate the properties of the reaction and the oxide layer, respectively.

The diameter of the microchannel 502 can be precisely controlled according to the oxidation conditions, the oxidation time and the like. The diameter can be controlled to be about 1 millimeter or less. The diameter can be well controlled according to the thickness of the oxide. However, in conditions where the final diameter is larger than the diameter of the channel obtained via silicon migration, part of the oxide can be removed. For example, part of the oxide can be removed by a hydrogen fluoride-containing solution. Controlling the oxide removal time can also control the diameter of the microchannel 502.

After the final diameter is reached, an apparatus can include the substrate 102 (also referred to as the silicon surface), one or more reservoirs within the substrate 102 (the walls of the one or more reservoirs can be oxidized), the oxidized microchannel 502 with a diameter of about 1 millimeter or less connecting the one or more reservoirs and buried beneath the silicon surface. The diameter of the oxidized microchannel 502 can be controlled through oxidation (growth of oxide or removal of oxide). The oxidized microchannel 502 can also run parallel to the surface of the substrate 102. The oxidized microchannel can be utilized in a number of ways to facilitate various biomedical engineering applications or thermal engineering applications. For example, the oxidized microchannel can be at least partially filled with a liquid crystal.

FIGS. 8-12 illustrate methods and/or flow diagrams in accordance with embodiments of this disclosure. For simplicity of explanation, the methods are depicted and described as a series of acts. However, acts in accordance with this disclosure can occur in various orders and/or concurrently, and with other acts not presented and described in this disclosure. Furthermore, not all illustrated acts may be required to implement the methods in accordance with the disclosed subject matter.

Figure 8:
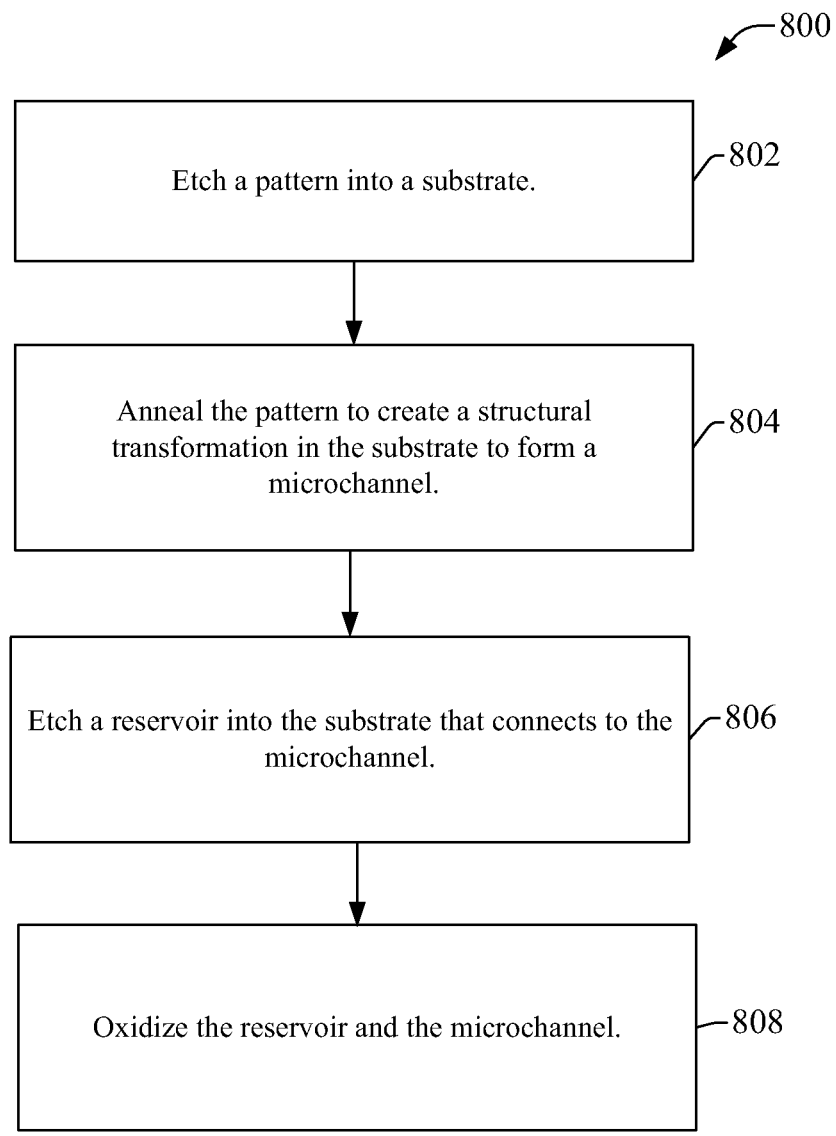
FIG. 8 is an example non-limiting process flow diagram of a method for forming an oxidized microchannel below and running parallel to a surface, according to an embodiment.

Referring now to FIG. 8, illustrated is an example non-limiting process flow diagram of a method 800 for forming an oxidized microchannel below and running parallel to a surface, according to an embodiment. The oxidized microchannel can have a controllable diameter (e.g., hydraulic diameter) that is controlled to be less than or equal to 1 millimeter.

At element 802, a pattern is etched into a substrate. The pattern can define different structures that can be etched into the substrate to facilitate formation of a microchannel buried beneath the surface of the substrate. The patterns can be elliptical, circular, or rectangular; however, the patterns are not limited to these shapes. The patterns can include any type of shape that can facilitate the formation of a microchannel.

The patterns can include a matrix of geometries. The matrix of geometries can be a single vector and can also include a matrix of any dimensions. It will be understood that the matrix can be aligned in any type of shape that facilitates the formation of the microchannel at a desired depth below the surface of the substrate with a desired diameter.

The pattern can be etched into the substrate by any type of etching technique that facilitates removal of portions of the substrate while leaving substantially vertical sides. In an embodiment, the etching technique includes a dry etching technique. In another embodiment, the etching technique includes a deep reactive-ion etching technique.

The etched pattern of structures can include structures of any shape, including, for example, cylinders or trenches not solely cylinders or trenches. The shape of the structures in the pattern of structures depends on the shape of the pattern drawn within a mask. The mask defines a part of the substrate that is etched and a part of the substrate that is not etched adjacent to the part that is etched.

At element 804, the pattern is annealed to create a structural transformation in the substrate to form the microchannel. The annealing process can be performed at a high temperature within a reducing or inert atmosphere. The high temperature annealing performed in the reducing or inert atmosphere facilitates migration of the material of the substrate to the surface and leaving a microchannel in its wake, formed from the etched structures. In other words, the microchannel can be buried beneath the surface of the substrate. The depth the microchannel is buried can be controlled according to the depth of the etched structures, for example. Subsequent epitaxial growth or silicon etching can be performed to further adjust this depth.

At element 806, one or more reservoirs can be etched into the substrate. The one or more reservoirs can be arranged in a pattern in a mask. The one or more reservoirs can be of any shape and any depth connect to one or more ends of the microchannel to facilitate subsequent oxidation of the surface of the microchannel. The one or more reservoirs also extend beyond the microchannel.

The one or more reservoirs can be utilized to facilitate control of the diameter of the microchannel. At element 808, the interior surfaces of the reservoir and the microchannel are oxidized. The oxidation can facilitate a precise control of the diameter of the microchannel. For example, the diameter can be controlled based on the thickness of the oxidation. The thickness of the oxidation can be controlled by the oxidation time and/or other parameters of the oxidation process.

Figure 9:
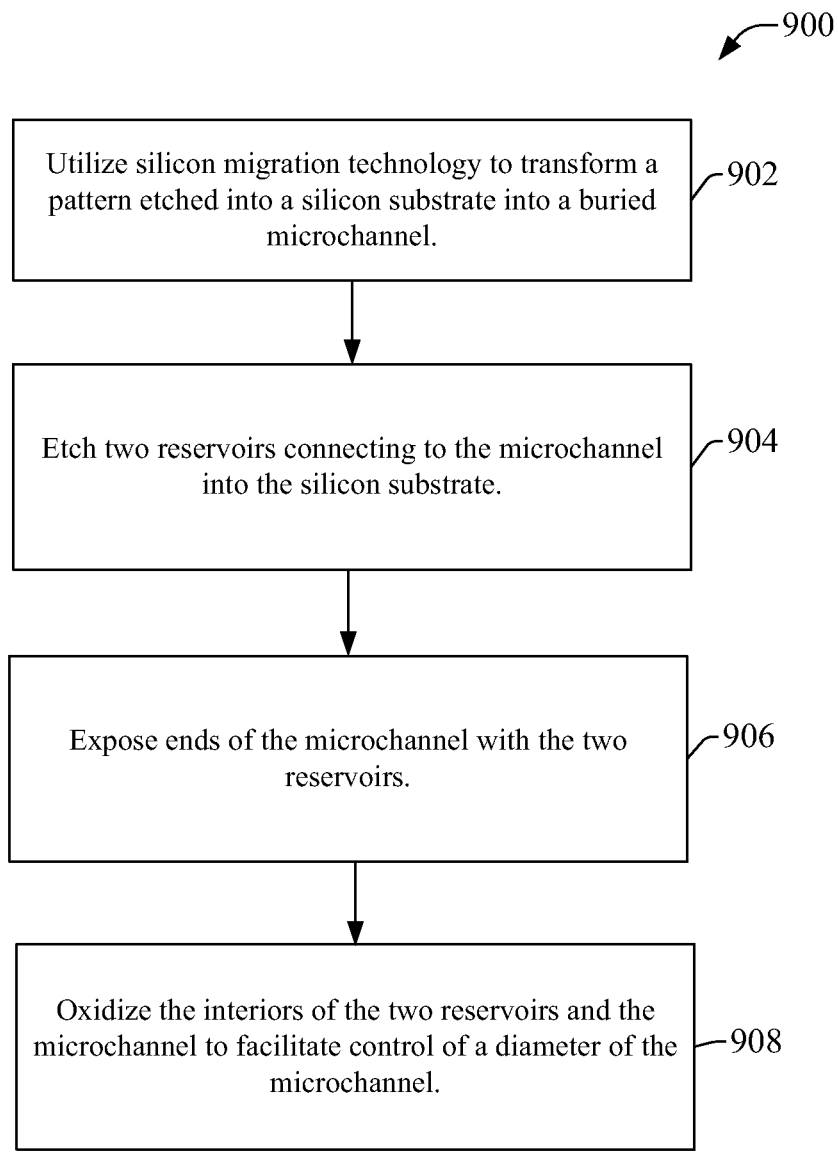
FIG. 9 is an example non-limiting process flow diagram of a method for fabricating a microchannel utilizing silicon migration technology, according to an embodiment.

Referring now to FIG. 9, illustrated is an example non-limiting process flow diagram of a method 900 for fabricating a microchannel utilizing silicon migration technology, according to an embodiment. Silicon migration technology is used herein for exemplary purposes only. Similar technologies can be used with different types of substrates.

At element 902, silicon migration technology is utilized to transform a pattern etched into a silicon substrate into a buried microchannel. The silicon migration technology facilitates the migration of silicon to the surface of the substrate. Accordingly, when a pattern is etched within the substrate and annealed at a high temperature, the silicon between the parts of the etched pattern migrates to the surface and facilitates a formation of a microchannel beneath the migrated silicon.

At 904, two reservoirs are etched into the silicon substrate. The two reservoirs can be arranged in a pattern in a mask. The two reservoirs, which can be of any shape and any depth, connect to two ends of the microchannel to facilitate subsequent oxidation of the surface of the microchannel. The two reservoirs also extend beyond the microchannel. At 906, the ends of the microchannel are exposed with the two reservoirs. The two reservoirs can be utilized to facilitate control of the diameter of the microchannel.

At element 908, the reservoirs and the microchannel are oxidized to facilitate control of the diameter of the microchannel. The oxidation can facilitate a precise control of the diameter of the microchannel. For example, the diameter can be controlled based on the thickness of the oxidation. The thickness of the oxidation can be controlled by the oxidation time and/or other parameters of the oxidation process.

Figure 10:
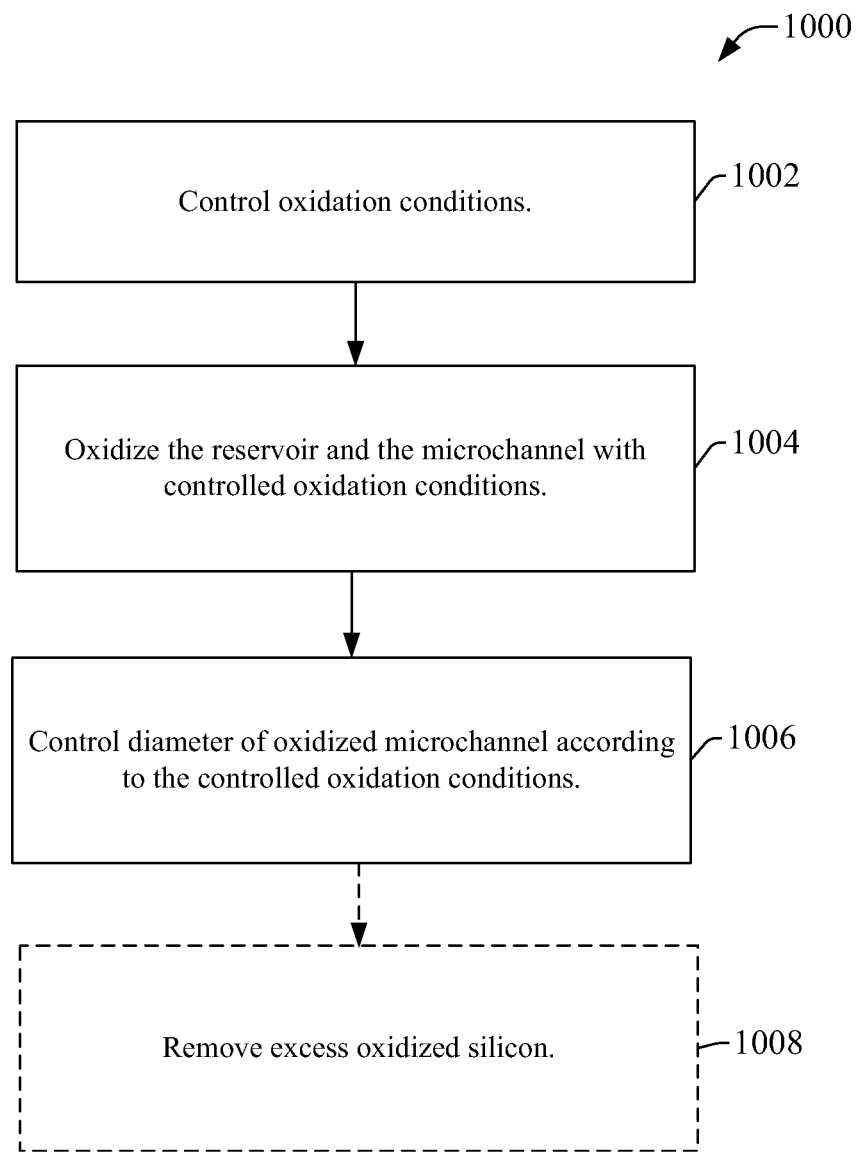
FIG. 10 is an example non-limiting process flow diagram of a method for controlling a diameter of a microchannel by controlling oxidation conditions, according to an embodiment.

Referring now to FIG. 10, illustrated is an example non-limiting process flow diagram of a method 1000 for controlling a diameter of a microchannel by controlling oxidation conditions, according to an embodiment. At element 1002, oxidation conditions are controlled. An example of an oxidation condition that can be controlled is the oxidation time. At element 1004, the interior surfaces of the reservoir and the microchannel can be oxidized under the controlled oxidation conditions.

At element 1006, the diameter of the oxidized microchannel can be controlled according to the controlled oxidation conditions. Optionally, at element 1008, excess oxidized silicon can be removed to increase the size of the diameter.

Figure 11:
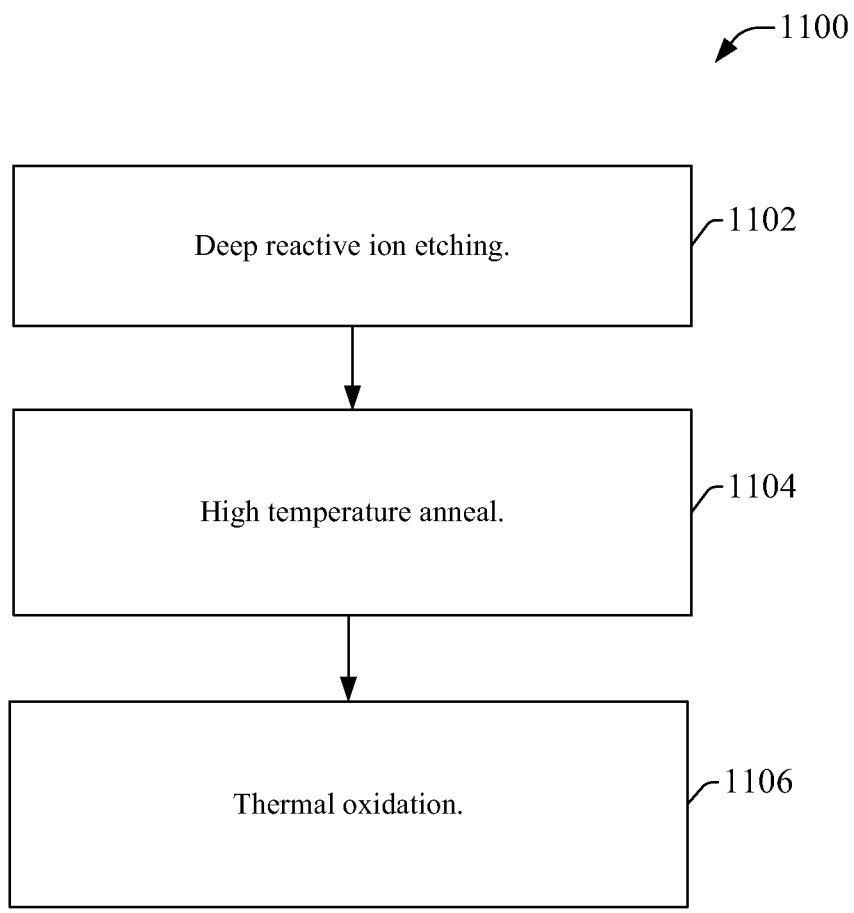
FIG. 11 is an example non-limiting process flow diagram of a method for burying a microchannel within a silicon substrate, according to an embodiment.

Referring now to FIG. 11, illustrated is an example non-limiting process flow diagram of a method 1100 for burying a microchannel within a silicon substrate, according to an embodiment. The method 1100 is merely one specific example of forming a buried microchannel with a controlled diameter in a silicon substrate. Different forms of etching, annealing and/or oxidizing techniques can be utilized to achieve the buried microchannel with the controlled diameter.

At element 1102, a deep reactive etching technique can be performed. Deep reactive-ion etching is a highly anisotropic etching process used to create deep penetration (deeper than reactive ion etching, as deep as 600 μm), steep-sided holes and trenches in the substrate, typically with high aspect ratios.

The deep reactive-ion technique can use fluorine ions ($F^-$) to facilitate the etching. This deep reactive-ion etching technique can achieve steep sided holes and trenches because the sidewalls are substantially protected. Fluorine radicals can spontaneously etch the silicon substrate and the spontaneous etch rate is reduced at the sidewalls. The deep reactive-ion process utilizes a high plasma density at a low pressure to achieve a fast etching speed. The low pressure can reduce ion scattering so that the ion trajectory is mostly vertical, so the ion species can be transported into deep trenches.

An example of an anisotropic etchant is $SF_6$, which exhibits a low toxicity compared to $F_2$. For example, in a cryo process deep reactive-ion etching process, $SF_6/O_2$ plasma can be used with a condensed $SiO_xF_y$ mask. In another example, in a Bosh process, pulsed process or time multiplexed process, $SF_6/C_4F_8$ can be used as the plasma and the mask can be used with a condensed n-$CF_2$ polymer.

At element 1104, high temperature annealing can be performed to facilitate formation of a buried microchannel. The buried microchannel covered by suspended silicon can be formed according to a silicon migration technology spurred by the high temperature annealing.

The silicon migration technology generally refers to a surface migration resulting in a structural transformation of the silicon substrate. For example, the non-etched parts of the silicon substrate can migrate to the surface of substrate, while the etched portions can form the microchannel because of the empty migrated portions. The silicon migration can depend on parameters, such as the temperature of the annealing, the pressure (the pressure of the gas used in the annealing), the type of gas used, the reaction time, and the like.

The high temperature annealing can be conducted at a temperature sufficient induce the silicon migration (in other words, the temperature high enough such that the etched portions can be annealed to facilitate formation of the microchannel). As a non-limiting example, the high temperature annealing can be conducted at a temperature from about 900 degrees Celsius to about 1300 degrees Celsius.

The high temperature annealing can be conducted at a pressure sufficient facilitate the silicon migration. According to a non-limiting example, the high temperature annealing can be conducted at a pressure from about $10^{-10}$ Ton to about 10 Torr.

The gas used in the annealing process can be a reducing gas or an inert gas. Examples of gasses that can be used as an ambient include, but are not limited to, one or more of hydrogen gas, argon gas, helium gas, neon gas, krypton gas, or nitrogen gas.

At element 1106, thermal oxidation can be performed to facilitate control of the diameter of the microchannel. The thermal oxidation of the substrate can oxidize the inside walls of the one or more reservoirs and the microchannel so that the diameter (hydraulic diameter) of the microchannel is a desired thickness.

Thermal oxidation can produce a thin layer of oxide (e.g., silicon dioxide) on the surface of the substrate. The thermal oxidation technique forces an oxidizing agent to diffuse into the substrate at a high temperature and react with the substrate. Thermal oxidation is often performed at a temperature from about 800 degrees Celsius to about 1200 degrees Celsius.

The thermal oxidation can be dry oxidation, using molecular oxygen as the oxidant, or wet oxidation, using water vapor as the oxidant. The oxidizing agent can also include several percent of hydrochloric acid or another agent to remove metal ions that may occur in the oxide.

Thermal oxidation is a well modeled process, so the diameter of the microchannel can be controlled according to the thickness of the oxide. The thickness of the oxide can be controlled according to the Deal-Grove model. According to the Deal-Grove model, the time t required to grow an oxide of thickness $X_o$ at a constant temperature on a bare silicon surface is:

$$t = \frac{X_o^2}{B} + \frac{X_o}{B/A},$$

where A and B are constants that encapsulate the properties of the reaction and the oxide layer, respectively.

The diameter of the microchannel can be precisely controlled according to the oxidation conditions, the oxidation time and the like. The diameter can be controlled to be about 1 millimeter or less. The diameter can be well controlled according to the thickness of the oxide. However, in conditions where the final diameter is larger than the diameter of the channel obtained via silicon migration, part of the oxide can be removed. For example, part of the oxide can be removed by a HF-containing solution. Controlling the oxide removal time can also control the diameter of the microchannel.

After the final diameter is reached, an apparatus can include the substrate (also referred to as the silicon surface), one or more reservoirs within the substrate (the walls of the one or more reservoirs can be oxidized), the oxidized microchannel with a diameter of about 1 millimeter or less connecting the one or more reservoirs and buried beneath the silicon surface. The diameter of the oxidized microchannel can be controlled through oxidation (growth of oxide or removal of oxide). The oxidized microchannel can also run parallel to the surface of the substrate.

Figure 12:
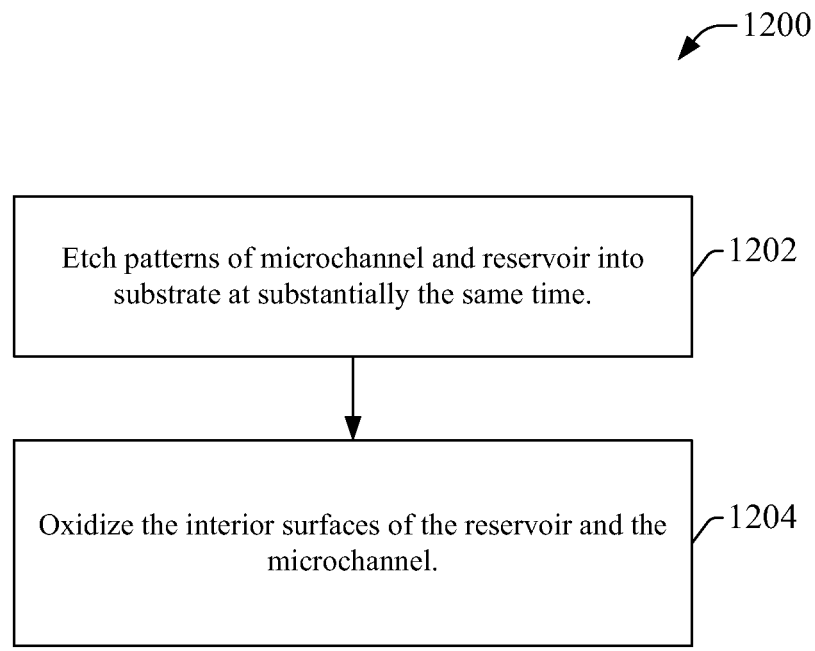
FIG. 12 is an example non-limiting process flow diagram of a further method for creating an oxidized microchannel, according to an embodiment.

Referring now to FIG. 12, illustrated is an example non-limiting process flow diagram of a further method 1200 for creating an oxidized microchannel, according to an embodiment. Method 1200 is similar to methods 800-1100 except for the etching of the reservoir into the substrate.

At element 1202, the pattern that will form the microchannel and the one or more reservoirs are etched into the surface at substantially the same time. For example, the pattern for the one or more reservoirs and the pattern for the structures that will form the microchannel can be drawn together on the same mask. Accordingly, both can be etched into the substrate at the same time. Due to the loading effect of dry etching (e.g., deep reactive-ion etching), the one or more reservoirs will be, in effect, deeper than the structures etched according to the pattern for the structures that will form the microchannel. In this way, the process can be finished with one single photolithography and etching step.

The structures etched according to the pattern for the structures that will form the microchannel are annealed at a high temperature to facilitate silicon migration. The microchannel can be formed as a result of the silicon migration. The microchannel can connect to the one or more reservoirs. At element

1204, the one or more reservoirs and the microchannel are oxidized. The oxidation can facilitate a controllable diameter of the microchannel, through growth of silicon dioxide or removal of silicon dioxide and the thickness of the oxidized layer can be controlled through oxidation temperature or other parameters of the oxidation process.

What has been described above includes examples of the embodiments of the subject disclosure. It is, of course, not possible to describe every conceivable combination of components or methods for purposes of describing the claimed subject matter, but it is to be appreciated that many further combinations and permutations of the various embodiments are possible. Accordingly, the claimed subject matter is intended to embrace all such alterations, modifications, and variations that fall within the spirit and scope of the appended claims. While specific embodiments and examples are described in this disclosure for illustrative purposes, various modifications are possible that are considered within the scope of such embodiments and examples, as those skilled in the relevant art can recognize.

In addition, the words "example" or "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

In addition, while an aspect may have been disclosed with respect to only one of several embodiments, such feature may be combined with one or more other features of the other embodiments as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements. Numerical data, such as temperatures, concentrations, times, ratios, and the like, are presented herein in a range format. The range format is used merely for convenience and brevity. The range format is meant to be interpreted flexibly to include not only the numerical values explicitly recited as the limits of the range, but also to include all the individual numerical values or sub-ranges encompassed within the range as if each numerical value and sub-range is explicitly recited. When reported herein, any numerical values are meant to implicitly include the term "about." Values resulting from experimental error that can occur when taking measurements are meant to be included in the numerical values.

What is claimed is:

1. A method, comprising:
    etching a pattern into a silicon substrate;
    annealing the pattern resulting in a structural transformation of an etched portion of the silicon substrate corresponding to the pattern into a microchannel that is located below a surface of the silicon substrate;
    etching a reservoir into the silicon substrate that connects to the microchannel; and
    oxidizing the reservoir and the microchannel via an oxidation of the silicon substrate.

2. The method of claim 1, wherein the annealing comprises annealing the pattern with at least one of a hydrogen gas ambient, an argon gas ambient, a helium gas ambient, a neon gas ambient, a krypton gas ambient, or a nitrogen gas ambient.

3. The method of claim 1, further comprising adjusting depth of the microchannel below the surface of the silicon substrate by at least one of epitaxy or etching.

4. The method of claim 1, further comprising controlling the hydraulic diameter of the microchannel by removing a portion of oxide from the microchannel.

5. The method of claim 1, wherein the etching the pattern further comprises etching the pattern into the silicon substrate by a dry etching technique.

6. The method of claim 1, wherein the annealing further comprises annealing the pattern at a temperature from about 900 degrees Celsius to about 1300 degrees Celsius and at a pressure from about 10-10 Torr to about 10 Torr.

7. The method of claim 1, further comprising controlling thickness of the oxidation of the silicon substrate as a function of an oxidation time.

8. The method of claim 1, wherein the etching the reservoir occurs at a substantially same time as the etching the pattern.

9. The method of claim 1, wherein the etching the reservoir occurs after the etching the pattern.

10. The method of claim 1, wherein the oxidizing further comprises oxidizing the reservoir and the microchannel by a thermal oxidation of the silicon substrate.

11. An apparatus, comprising:
    a silicon substrate;
    a first reservoir within the silicon substrate;
    a second reservoir within the silicon substrate; and
    an oxidized microchannel that connects the first reservoir and the second reservoir, is buried beneath a silicon surface of the silicon substrate, and is surrounded by silicon of the silicon substrate.

12. The apparatus of claim 11, wherein the oxidized microchannel runs parallel to the silicon surface.

13. The apparatus of claim 11, wherein a wall of the first reservoir or a wall of the second reservoir is oxidized.

14. The apparatus of claim 11, wherein the hydraulic diameter of the oxidized microchannel is controllable according to a time of oxidation of the silicon surface.

15. A method, comprising:
    applying silicon migration to a silicon substrate to facilitate forming a plurality of microchannel structures in the silicon substrate; and
    oxidizing the silicon substrate to facilitate forming a plurality of oxidized microchannels in parallel as a function of an oxidation time associated with the oxidizing, the plurality of oxidized microchannels being formed parallel to a surface of the silicon substrate and being buried within the silicon substrate.

16. The method of claim 15, wherein the applying further comprises:
    etching a pattern of structures including a vertical structure on the silicon substrate; and
    annealing the pattern of structures into the silicon substrate.

17. The method of claim 15, wherein a horizontal cross section of the vertical structure is elliptical or rectangular.

18. The method of claim 15, wherein the vertical structure comprises a matrix of patterns of geometries, and wherein the matrix comprises a single row vector.

19. The method of claim 15, wherein the plurality of oxidized microchannels comprises a hydraulic diameter of 1 millimeter or less in the silicon substrate.

20. The method of claim 15, wherein the plurality of oxidized microchannels comprises a liquid crystal.

* * * * *